(12) United States Patent
Farrar et al.

(10) Patent No.: US 7,727,868 B2
(45) Date of Patent: Jun. 1, 2010

(54) APPARATUS AND METHOD FOR CONTROLLING DIFFUSION

(75) Inventors: Paul A. Farrar, Okatie, SC (US); Jerome M. Eldridge, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 579 days.

(21) Appl. No.: 11/214,555

(22) Filed: Aug. 30, 2005

(65) Prior Publication Data

US 2006/0003535 A1    Jan. 5, 2006

Related U.S. Application Data

(62) Division of application No. 10/326,935, filed on Dec. 20, 2002, now abandoned.

(51) Int. Cl.
*H01L 21/22* (2006.01)
*H01L 21/38* (2006.01)

(52) U.S. Cl. .................. 438/542; 438/369; 438/541; 257/E21.056; 257/E21.135; 257/E21.142; 257/E21.153

(58) Field of Classification Search ............ 438/505, 438/526, 264, 369, 541–543, 560; 257/607, 257/315, 167, 344, E21.056, E21.135, E21.142, 257/E21.153
See application file for complete search history.

(56) References Cited

U.S. PATENT DOCUMENTS

| | | | |
|---|---|---|---|
| 3,082,131 A | * | 3/1963 | Cornelison .................. 257/167 |
| 3,748,198 A | | 7/1973 | Basi et al. |
| 3,812,519 A | * | 5/1974 | Nakamura et al. .......... 257/607 |
| 3,886,569 A | | 5/1975 | Basi et al. |
| 4,111,719 A | | 9/1978 | Mader et al. |
| 4,137,103 A | | 1/1979 | Mader et al. |
| 4,155,785 A | | 5/1979 | Cuomo et al. |
| 4,332,627 A | | 6/1982 | Schmitt et al. |
| 4,369,072 A | | 1/1983 | Bakeman et al. |
| 4,507,159 A | | 3/1985 | Erb |
| 4,569,697 A | | 2/1986 | Tsu et al. |

(Continued)

OTHER PUBLICATIONS

Darken, L S., et al., "Physical chemistry of metals", Book, Published New York, McGraw-Hill,(1953),74-90, 457-458.

(Continued)

*Primary Examiner*—Davienne Monbleau
*Assistant Examiner*—Monica D Harrison
(74) *Attorney, Agent, or Firm*—Schwegman, Lundberg & Woessner, P.A.

(57) ABSTRACT

A method and device for reducing a dopant diffusion rate in a doped semiconductor region is provided. The methods and devices include selecting a plurality of dopant elements. Selection of a plurality of dopant elements includes selecting a first dopant element with a first atomic radius larger than a host matrix atomic radius and selecting a second dopant element with a second atomic radius smaller than a host matrix atomic radius. The methods and devices further include selecting amounts of each dopant element of the plurality of dopant elements wherein amounts and atomic radii of each of the plurality of dopant elements complement each other to reduce a host matrix lattice strain. The methods and devices further include introducing the plurality of dopant elements to a selected region of the host matrix and annealing the selected region of the host matrix.

23 Claims, 7 Drawing Sheets

U.S. PATENT DOCUMENTS

| | | | |
|---|---|---|---|
| 4,629,520 A | 12/1986 | Ueno et al. | |
| 4,746,964 A | 5/1988 | Aronowitz | |
| 4,769,689 A | 9/1988 | Lin | |
| 4,778,772 A | 10/1988 | Takahashi et al. | |
| 4,851,360 A | 7/1989 | Haken et al. | |
| 4,875,085 A | 10/1989 | Ueno et al. | |
| 5,021,851 A | 6/1991 | Haken et al. | |
| 5,060,033 A * | 10/1991 | Takeuchi | 257/344 |
| 5,116,455 A | 5/1992 | Daly | |
| 5,190,887 A * | 3/1993 | Tang et al. | 438/264 |
| 5,212,101 A | 5/1993 | Canham et al. | |
| 5,231,298 A | 7/1993 | Daly | |
| 5,245,208 A | 9/1993 | Eimori | |
| 5,261,999 A | 11/1993 | Pinker et al. | |
| 5,280,185 A | 1/1994 | Aronowitz et al. | |
| 5,281,831 A | 1/1994 | Uemoto et al. | |
| 5,311,055 A | 5/1994 | Goodman et al. | |
| 5,345,104 A | 9/1994 | Prall et al. | |
| 5,389,809 A | 2/1995 | Haken et al. | |
| 5,510,630 A | 4/1996 | Agarwal et al. | |
| 5,561,072 A | 10/1996 | Saito | |
| 5,654,210 A * | 8/1997 | Aronowitz et al. | 438/526 |
| 5,789,310 A | 8/1998 | Pramanick et al. | |
| 5,814,541 A | 9/1998 | Shibata | |
| 5,837,597 A | 11/1998 | Saito | |
| 5,937,318 A * | 8/1999 | Warner et al. | 438/505 |
| 6,037,625 A * | 3/2000 | Matsubara et al. | 257/315 |
| 6,133,082 A | 10/2000 | Masuoka | |
| 6,198,167 B1 | 3/2001 | Economikos et al. | |
| 6,235,599 B1 | 5/2001 | Yu | |
| 6,258,695 B1 | 7/2001 | Dunn et al. | |
| 6,368,928 B1 | 4/2002 | Wang et al. | |
| 6,437,374 B1 | 8/2002 | Northrup et al. | |
| 6,455,402 B2 | 9/2002 | Lee et al. | |
| 6,518,150 B1 | 2/2003 | Matsumoto | |
| 6,576,521 B1 | 6/2003 | Chaudhry et al. | |
| 6,589,830 B1 | 7/2003 | Zeng | |
| 6,696,341 B1 | 2/2004 | Sonoda | |
| 6,797,593 B2 | 9/2004 | Chakravarthi et al. | |
| 6,930,360 B2 | 8/2005 | Yamauchi et al. | |
| 6,991,972 B2 | 1/2006 | Lochtefeld et al. | |
| 7,297,617 B2 | 11/2007 | Farrar et al. | |
| 7,301,221 B2 | 11/2007 | Farrar et al. | |
| 7,585,753 B2 | 9/2009 | Farrar et al. | |
| 7,592,242 B2 | 9/2009 | Farrar et al. | |
| 2002/0063294 A1 | 5/2002 | Brown et al. | |
| 2003/0013260 A1 | 1/2003 | Gossmann et al. | |
| 2003/0075806 A1 | 4/2003 | Reber | |
| 2003/0087510 A1 | 5/2003 | Chen | |
| 2004/0038468 A1 | 2/2004 | Hwang et al. | |
| 2005/0026403 A1 | 2/2005 | Lee et al. | |
| 2008/0070392 A1 | 3/2008 | Farrar et al. | |

OTHER PUBLICATIONS

Eldridge, J M., et al., "Lowering stresses in silicon due to the presence of high concentration of N-type dopant", *IBM Technical Disclosure Bulletin*, vol. 14, No. 10. (1972),3013-14.

Swalin, R. A., "Thermodynamics of solids", Book, Published New York, Wiley Series: Wiley series on the science and technology of materials,(1962),149-155.

Trumbore, F A., "Solid Solubilities of Impurity Elements in Germanium and Silicon", *The Bell System Technical Journal*, 39, I.M. Mackintosh unpublished data is quoted by F.A. Trumbore in this article., (1960),205-233.

\* cited by examiner

APPARATUS AND METHOD FOR CONTROLLING DIFFUSION

CROSS-REFERENCE TO RELATED APPLICATIONS

The application is a divisional of U.S. application Ser. No. 10/326,935, filed on Dec. 20, 2002 now abandoned, which is incorporated herein by reference in its entirety.

TECHNICAL FIELD

This invention relates to semiconductor devices and semiconductor device fabrication. Specifically this invention relates to a method and apparatus of doping semiconductor regions and diffusion of dopants during semiconductor processing.

BACKGROUND

As the minimum feature size achievable in semiconductor manufacturing decreases, impurity diffusion rates of dopants become a significant impediment for achieving the desired device structures and corresponding performances. Unfortunately there are only a limited number of possible solutions for this problem. As the minimum feature size decreases, the number of devices that can be formed in a given area increases with the inverse square of this feature size while dopant diffusion rates remain constant. As the areal density of devices is raised, both the device size and inter-device distances must shrink accordingly. In addition, as device areas have been shrunken laterally, optimal dopant diffusion depths have been substantially decreased.

Using current processing methods, dopant diffusion depth is largely affected by annealing operations, typically performed subsequent to an implant step. Thermal annealing is performed for a number of reasons, including activation of implanted dopant ions. Annealing also causes diffusion of the dopant species. Depending on the device design requirements and processes, the resulting redistribution of the as-implanted dopant ions can be unacceptably large.

What is needed is a method to control diffusion of dopant species in a matrix lattice. What is also needed is a device with a sharper diffusion gradient of dopant elements. What is also needed is a device capable of withstanding higher processing temperatures for longer periods of time without unacceptable diffusion of dopant elements.

SUMMARY

A method of reducing a dopant diffusion rate in a doped semiconductor region is shown. The method includes selecting a plurality of dopant elements. Selection of a plurality of dopant elements includes selecting a first dopant element with a first atomic radius larger than a host matrix atomic radius and selecting a second dopant element with a second atomic radius smaller than a host matrix atomic radius. The method further includes selecting amounts of each dopant element of the plurality of dopant elements wherein amounts and atomic radii of each of the plurality of dopant elements complement each other to reduce a host matrix lattice strain. The method further includes introducing the plurality of dopant elements to a selected region of the host matrix and annealing the selected region of the host matrix.

A method of forming a doped semiconductor region is further shown, including forming a first conductivity type doped semiconductor well, including introducing a first dopant element and a second dopant element to a selected region of a semiconductor surface. The method also includes forming a second conductivity type doped semiconductor region substantially within the first type doped semiconductor well, including introducing a third dopant element and a fourth dopant element. The method also includes annealing the selected region of the semiconductor surface and controlling a diffusion rate of the first and second dopant elements by selecting a combination of dopant elements that minimize lattice strain in the selected region of the semiconductor surface. The method also includes controlling a diffusion rate of the third and fourth dopant elements by selecting a combination of dopant elements that minimize lattice strain in the selected region of the semiconductor surface.

Methods of forming devices such as a transistor, a memory device, and an information handling system are also included in embodiments as described in the specification below.

A semiconductor junction is also shown, including a first conductivity type semiconductor region, wherein the first conductivity type semiconductor region includes a first plurality of dopant elements chosen to minimize a host semiconductor lattice stress. The semiconductor junction also includes a second conductivity type semiconductor region located substantially within the first conductivity type semiconductor region, wherein the second conductivity type semiconductor region includes a second plurality of dopant elements chosen to minimize the host semiconductor lattice stress.

A device such as a transistor, a memory device, and an information handling system may also be formed according to the specification below.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form a device or integrated circuit (IC) structure. The term substrate is understood to include semiconductor wafers. The term substrate is also used to refer to semiconductor structures during processing, and may include other layers, such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled. The term host matrix refers to a material as used in a composite structure such as a semiconductor matrix with dopant impurities. One example of a host matrix includes, but is not limited to, a semiconductor wafer. The term host lattice refers to a structure or regular pattern of atoms within the host matrix.

Figure 1A:
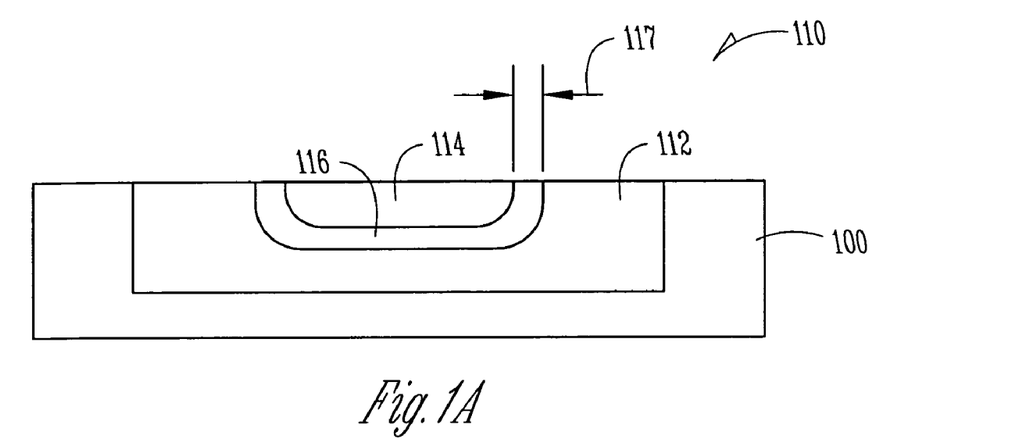
FIG. 1A shows a prior diffusion profile within a doped semiconductor region.

FIG. 1A shows a semiconductor substrate 100 with a junction 110 formed in a portion of the semiconductor substrate 100. In one embodiment, the junction 110 is formed within a well region or pocket 112 that is also formed in a portion of the semiconductor substrate 100. Using prior methods, the junction is formed by introducing a dopant element to a first region 114 using processes such as ion implantation. Processes such as ion implantation force high energy ions into a surface of the semiconductor substrate 100 or pocket 112. A microstructure of the surface, after implantation, is damaged and the ions are not electrically activated within the region of the semiconductor substrate 100 or pocket 112.

To remove the damage from ion implantation, and to activate the ions, an annealing process is performed. Annealing also drives diffusion of the dopant element from the first region 114 to a diffused region 116. Using prior methods, the diffused region 116 yielded an unacceptable depth 117 as shown in FIG. 1A.

Figure 1B:
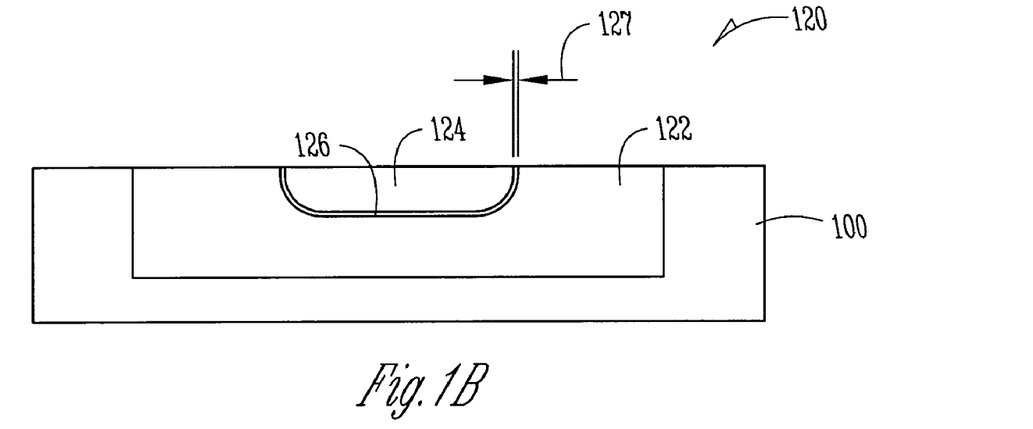
FIG. 1B shows a diffusion profile within a doped semiconductor region according to one embodiment of the invention.

FIG. 1B shows a semiconductor substrate 100 with a junction 120 formed in a portion of the semiconductor substrate 100. Similar to FIG. 1A, in one embodiment, the junction 120 is formed within a well region or pocket 122 that is also formed in a portion of the semiconductor substrate 100. Using novel methods that will be described below, dopant elements are introduced to a first region 124. Following an annealing procedure, dopant elements are driven by diffusion from the first region 124 to a diffused region 126. As shown by FIG. 1B, the diffused region 127 shows a steeper diffusion profile with a smaller diffusion depth 127. It should be noted that FIGS. 1A and 1B are diagrams for illustration of differences between junctions in prior configurations in contrast to junctions after using the methods described below. FIGS. 1A and 1B are not necessarily drawn to scale.

Diffusion is normally thought of as occurring by the random motion of atoms with the energy being thermal, with the driving force being a function of temperature and concentration. Therefore the higher the temperature, the more rapid the diffusion rate. However, it has been discovered that the rate of diffusion of one element in another is a function of not only temperature but other factors such as crystal defects, in a specimen. For example, the rate of diffusion at grain boundaries may be over an order of magnitude greater than that in the bulk material.

Figure 2A:
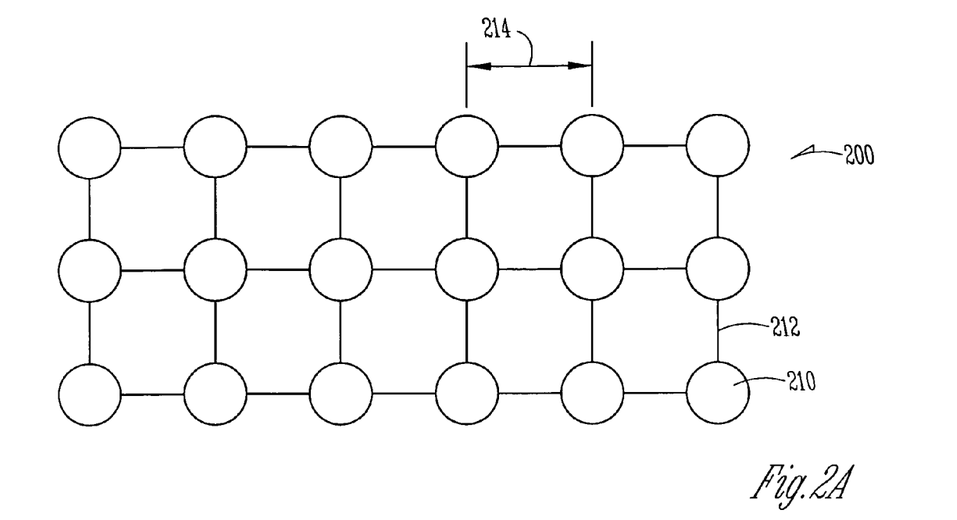
FIG. 2A shows a model of an undistorted semiconductor material according to one embodiment of the invention.

FIG. 2A shows one embodiment of a host semiconductor lattice 200. The lattice 200 is made up of a number of host atoms 210 that are held together by bonds 212. Although a two dimensional lattice is shown for illustration, one of ordinary skill in the art will recognize that the concepts illustrated in FIGS. 2A-2C apply to three dimensional lattices. In one embodiment, the host semiconductor lattice 200 is made up of silicon atoms. Although a silicon host semiconductor lattice 200 is used as an example, other host semiconductor lattice compositions such as gallium arsenide, etc. are within the scope of the invention. In one embodiment, the host semiconductor lattice 200 is structured in a regular patterned crystalline form. In a crystal, the bonds 212 are arranged in a regular pattern throughout the lattice 200. For illustration purposes, the bonds 212 are shown with equal bond lengths 214.

Although in one embodiment, all bonds 212 are substantially the same length 214, other embodiments are included where bond lengths 214 vary within the lattice 200 to form an energetically favorable atomic stacking arrangement in the host lattice 200. In describing a lattice 200, as illustrated in FIG. 2A, individual atoms 210 can be described as hard spheres that can be stacked a number of ways. A number of regular patterns of atomic stacking are therefore possible, some with equal bond lengths 214 and some with repeating variations in bond lengths 214, depending on the atomic composition and solid phase of the host matrix.

Dopant elements used to form the junctions in a silicon transistor are substantial (i.e., occupy lattice sites normally occupied by Si atoms). Since the radii of dopant ions differ from that of a silicon host matrix, the resulting differences in size imparts strain to the doped silicon region. This strain becomes especially large as the dopant concentration is raised to the levels needed to form the necessary junctions.

Figure 2B:
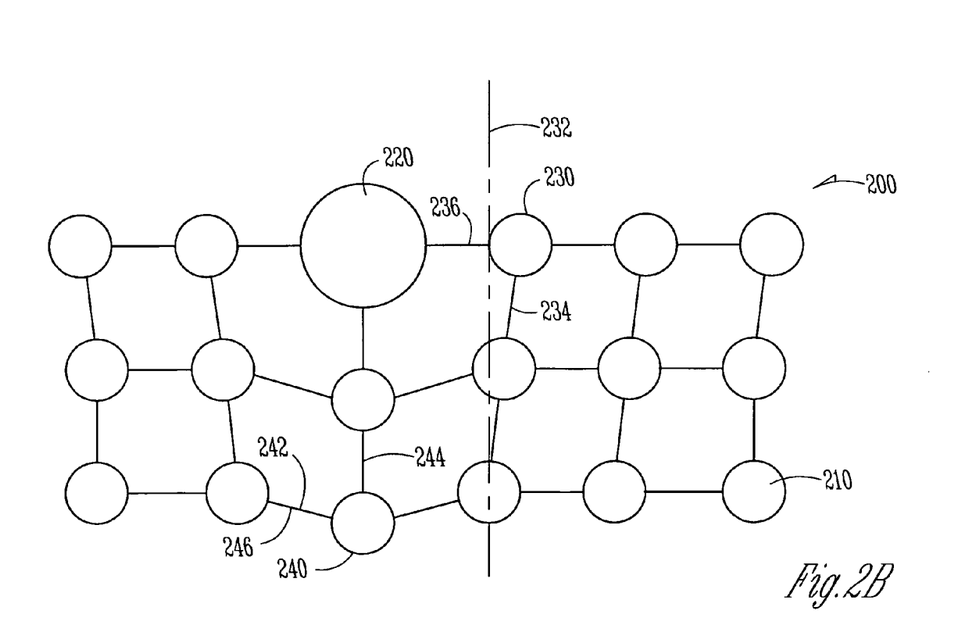
FIG. 2B shows a model of a doped semiconductor material according to one embodiment of the invention.

FIG. 2B illustrates the host matrix 200 from FIG. 2A with the addition of a dopant atom 220. As discussed above, the dopant atom 220 is located in a substitutional lattice site. The dopant atom 220 causes lattice strain, thus distorting the regular pattern of the host lattice 200 that existed when the dopant atom 220 was not present. Host atom 230 has been moved from an unstrained position on line 232 to a strained location, thus distorting bonds 234 and 236. As can be seen from the Figure, other host atoms and bonds are similarly distorted. The effect of lattice strain is not limited to the host atoms directly adjacent to the dopant atom 220. Host atom 240 has been moved from an unstrained position on line 242 to a strained location, thus distorting bonds 244 and 246.

Although FIG. 2B shows a dopant atom 220 with an atomic radius that is larger than the atomic radius of the host matrix atoms, a dopant atom 220 with an atomic radius that is smaller than the atomic radius of the host matrix atoms causes similar lattice distortion. Instead of the bonds such as 234 and 236 being compressed, the bonds adjacent to a smaller dopant atom are stretched, thus causing host lattice distortion. It has been discovered that such dopant-induced strains provide a driving force to cause enhanced, non-random diffusion effects. To reduce unwanted diffusion, it therefore follows that the net lattice strain in a junction should be at or near zero. In one embodiment, this can be achieved by using two or more dopants of the same type in each junction with at least one of the dopants having an atomic size smaller and one larger than silicon. The percentages of each being so chosen that the net size effect approaches zero.

Figure 2C:
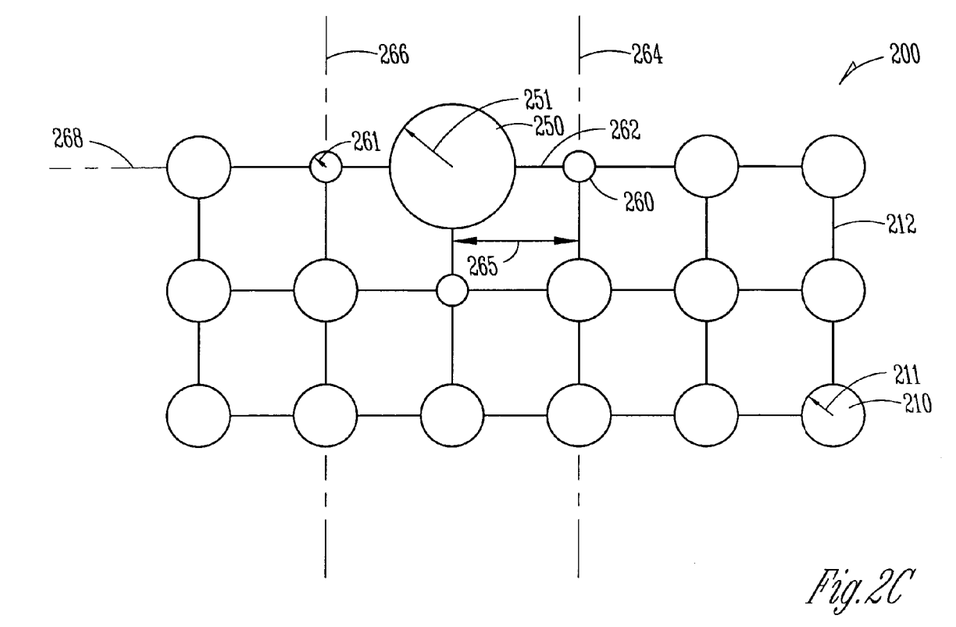
FIG. 2C shows another model of a doped semiconductor material according to one embodiment of the invention.

FIG. 2C shows the host matrix 200 from FIGS. 2A, and 2B with the addition of multiple dopant atoms. In one embodiment, the multiple dopant atoms include a first dopant atom 250 with an atomic radius 251 that is larger that at atomic radius 211 of host atoms 210. In one embodiment, the multiple dopant atoms further include a second dopant atom 260 with an atomic radius 261 that is smaller that the atomic radius 211 of host atoms 210. In one embodiment, the multiple dopant atoms include P-type dopant atoms. In one embodiment, the multiple dopant atoms include N-type dopant atoms. Examples of suitable N-type dopant atoms include, but are not limited to, arsenic (As), phosphorous (P), Bismuth (Bi), and Antimony (Sb). Examples of suitable P-type dopant atoms include, but are not limited to, Aluminum (Al) and Boron (B). Although FIG. 2C shows a host lattice 200 with two different dopant atoms, other embodiments include more than two different dopant atoms.

In one embodiment, a specific proportion of dopant atoms is further chosen for introduction to the lattice 200. When a specific combination of multiple dopant atoms is used at a specific proportion, strain in the lattice 200 is reduced significantly. As shown in FIG. 2C, the larger radius 251 of the first dopant atom 250 complements the smaller radius 261 of the second dopant atom 260. In contrast to the lattice distortion shown in FIG. 2B, atoms in the lattice, including both host matrix atoms and dopant atoms, are substantially lined up as in the unstressed state of FIG. 2A. Dopant atom 260 is shown along substantially undistorted lines 264 and 268, and dopant atom 261 is shown along substantially undistorted lines 266 and 268. Although selected bonds such as bond 262 in the doped lattice 200 of FIG. 2C may be shorter or longer than host matrix bonds 212, a center to center spacing 265 is approximately equal to the length of host matrix bonds 212.

Although FIG. 2C shows the larger first dopant atom 250 bonded adjacent to the smaller second dopant atom 260 this specific configuration is for illustration only. When multiple dopant atoms are selected and introduced to the host lattice 200 in the correct proportions, lattice strain is minimized regardless of which host lattice sites the multiple dopant atoms are located on. Small dopant atoms do not necessarily have to be directly bonded to large dopant atoms. On a macroscopic scale, an average lattice strain is reduced due to the size of dopant atoms selected and the proportion in which they are introduced.

In a two dopant atom embodiment, the proportions of dopant atoms can be chosen by the following formula:

$$x=(R_h-R_s)/[(R_l-R_h)+(R_h-R_s)]$$

Where:
$R_h$=the atomic radius of a host atom
$R_l$=the atomic radius of the dopant atom that is larger than the host atom
$R_s$=the atomic radius of the dopant atom that is smaller than the host atom
x=the fraction of large dopant atoms to introduce to the host lattice
1−x=the fraction of small dopant atoms to introduce to the host lattice For example, if the host atom has a relative radius of 2, the large dopant atom has a relative radius of 6, and the small dopant atom has a relative radius of 1, then "x" would equal 0.20 and "1−x" would equal 0.80. A resulting dopant proportion would include one large dopant atom for every four small dopant atoms. Similarly, if three or more dopant atoms are used, the proportion of dopant atoms that are larger than the host matrix atoms should compensate for the proportions of dopant atoms that are smaller that the host matrix atoms, while taking into consideration the relative sizes of the dopant atoms and the host matrix atoms.

In one embodiment for making an N-type junction, both arsenic (As) and phosphorous (P) are used as dopants. To compensate for the atomic radii of the dopant atoms, approximately 36.37 percent of the dopant concentration is phosphorus and approximately 63.63 percent of the dopant concentration is arsenic. In one embodiment for making a P-type junction, both boron (B) and aluminum (Al) are used as dopants. To compensate for the atomic radii of the dopant atoms, approximately 23.68 percent of the dopant concentration is boron and approximately 76.32 percent of the dopant concentration is aluminum.

In one embodiment, introduction of the multiple dopant atoms to the host lattice 200 includes an ion implantation process. As discussed above, following ion implantation, there is damage to the host lattice that must be repaired. Further, the implanted dopant atoms must be activated to realize their desired electrical properties. In one embodiment, an anneal step is performed following introduction of the dopant atoms to the host lattice. In one embodiment, a rapid thermal anneal process is used following introduction of the dopant atoms to the host lattice. By choosing a combination of multiple dopant atoms, introduced to a host lattice at a specific proportion as described above, the post anneal doped region exhibits significantly reduced lattice strain. The reduced lattice strain significantly reduces unwanted enhanced, non-random diffusion effects.

One advantage of methods described above is that the methods effectively reduce the rate of diffusion of the doping elements in very shallow junctions so that they can be exposed to a higher time temperature envelope without excessive degradation of the structure. Another advantage of methods described above is that the methods sharpen a junction profile by reducing diffusion rates at current anneal times and temperatures. A further advantage of methods described above is that solubility in doped regions will be increased. Thus allowing for a higher maximum doping level.

Figure 3:
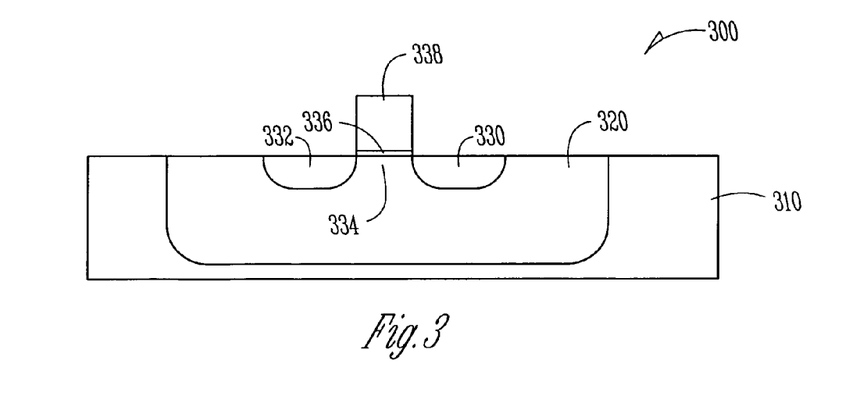
FIG. 3 shows an example of semiconductor device according to one embodiment of the invention.

FIG. 3 shows one example of a device that is formed using the methods described above. FIG. 3 shows a transistor 300 formed in a semiconductor substrate 310. Other devices apart from transistors may also be formed using the methods described above. In one embodiment, the transistor is further formed in a doped pocket 320. The transistor 300 includes a first source/drain region 330, a second source drain region 332, and a channel region 334 separating the first and second source/drain regions 330, 332. A gate 338 is formed over the channel region 334, with a gate oxide 336 separating the channel region 334 from the gate 338.

In one embodiment, the first and second source/drain regions 330, 332 are formed using the multiple dopant implant methods described above. In one embodiment including a doped pocket 320, the doped pocket 320 is also formed using the multiple dopant methods described above.

In one embodiment, the doped pocket 320 is formed using multiple dopant atoms of a type that is complementary to the source/drain regions. In one embodiment, the source/drain regions 330/332 include P-type dopant atoms, and the pocket 320 includes N-type dopant atoms. In one embodiment, the source/drain regions 330/332 include N-type dopant atoms, and the pocket 320 includes P-type dopant atoms.

The following is an example of process conditions in one embodiment of an N-type junction in a P-type pocket. Where the desired junction depth is approximately 500 Angstroms and the pocket depth is approximately 2,000 Angstroms, the P pocket would be constructed using a 135 KEV aluminum and a 60 KEV boron deposition. If the total concentration of the pocket was to be $10^{20}$, then a $0.7632 \times 10^{20}$ aluminum deposition would be used and a $0.2368 \times 10^{20}$ boron deposition would be used. The 500 Angstrom N-type junction would be constructed using a 40 KEV phosphorus and a 70 KEV arsenic deposition. It the total concentration of the diffusion was to be $5 \times 10^{20}$, then the phosphorus concentration would be $1.82 \times 10^{20}$ and the arsenic concentration would be $3.18 \times 10^{20}$.

Diffusion of dopant atoms in a junction is significantly reduced when both a pocket and a region within a pocket are formed using multiple dopant atoms that are selected and proportioned as described in embodiments above. Junctions can be used to form devices that include, but are not limited to transistors, capacitors, etc.

Figure 4:
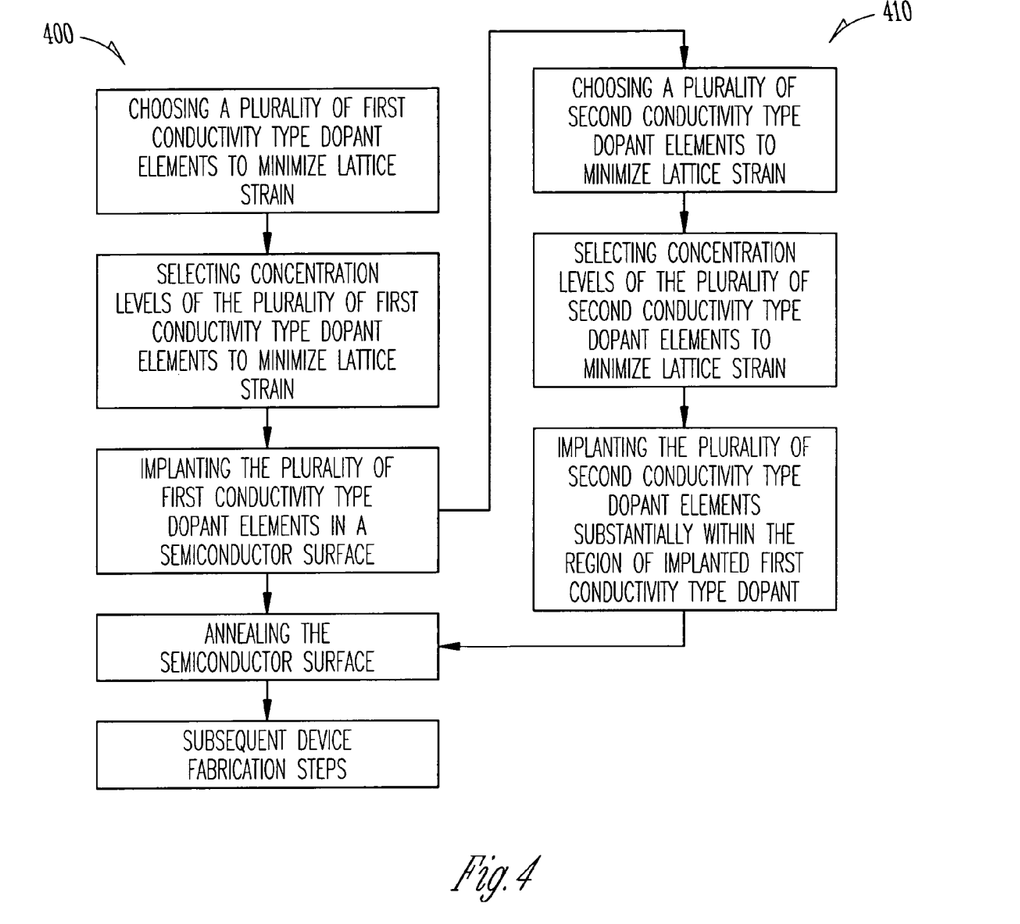
FIG. 4 shows a flow diagram according to one embodiment of the invention.

FIG. 4 shows a flow diagram of a method of fabricating a junction in a semiconductor device. A first flow 400 includes operations for forming a region using multiple dopant atoms to reduce lattice strain as described in embodiments above. A second flow 410 is included in one embodiment to include forming a doped region within another doped region. Both methods are effective to significantly reduce diffusion rates of dopant elements during processing steps such as annealing.

Figure 5:
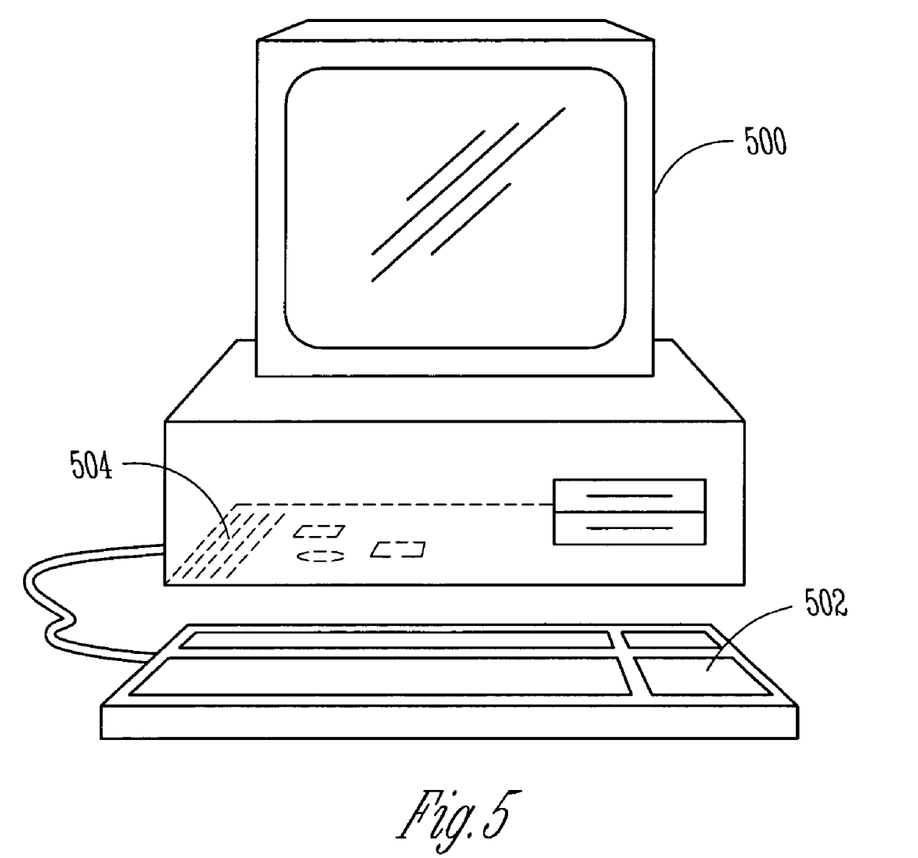
FIG. 5 shows an information handling system according to one embodiment of the invention.
Figure 6:
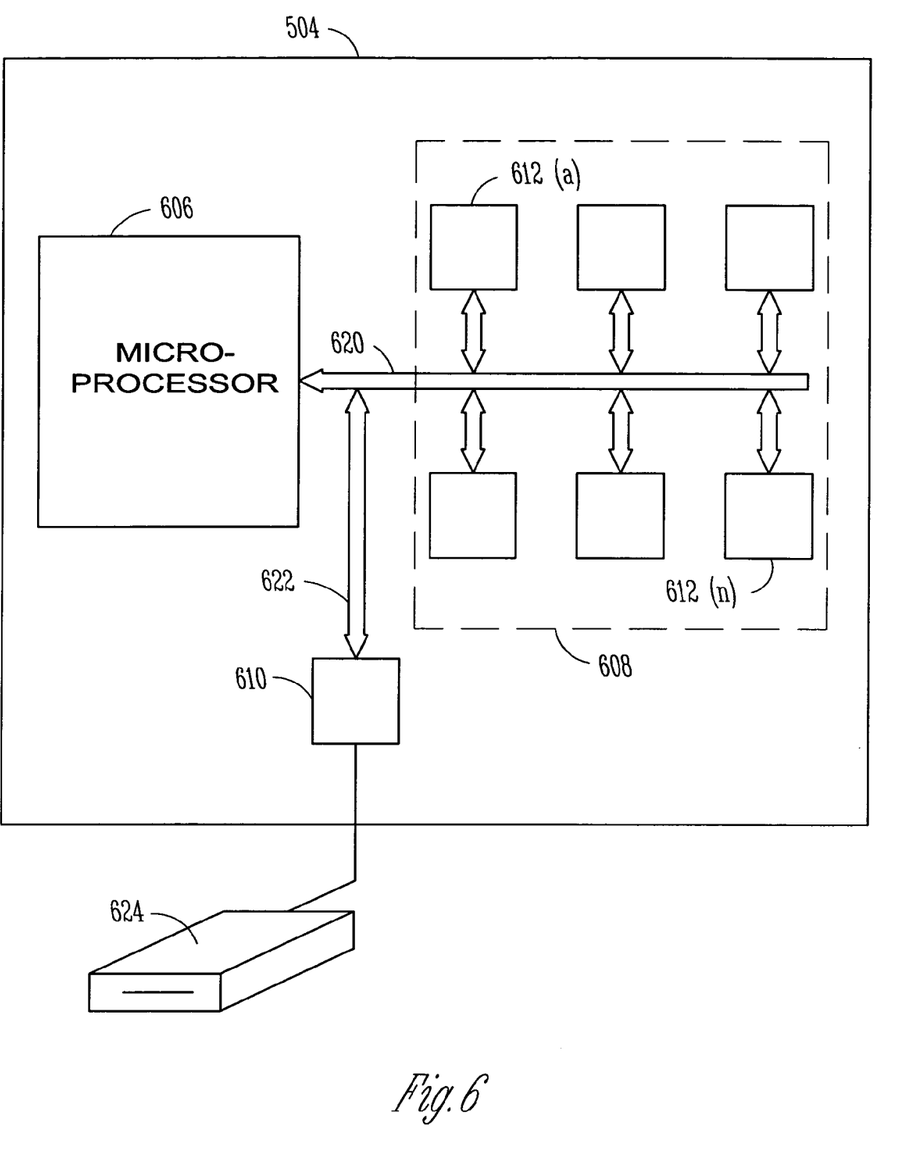
FIG. 6 shows a block diagram of a processing unit according to one embodiment of the invention.
Figure 7:
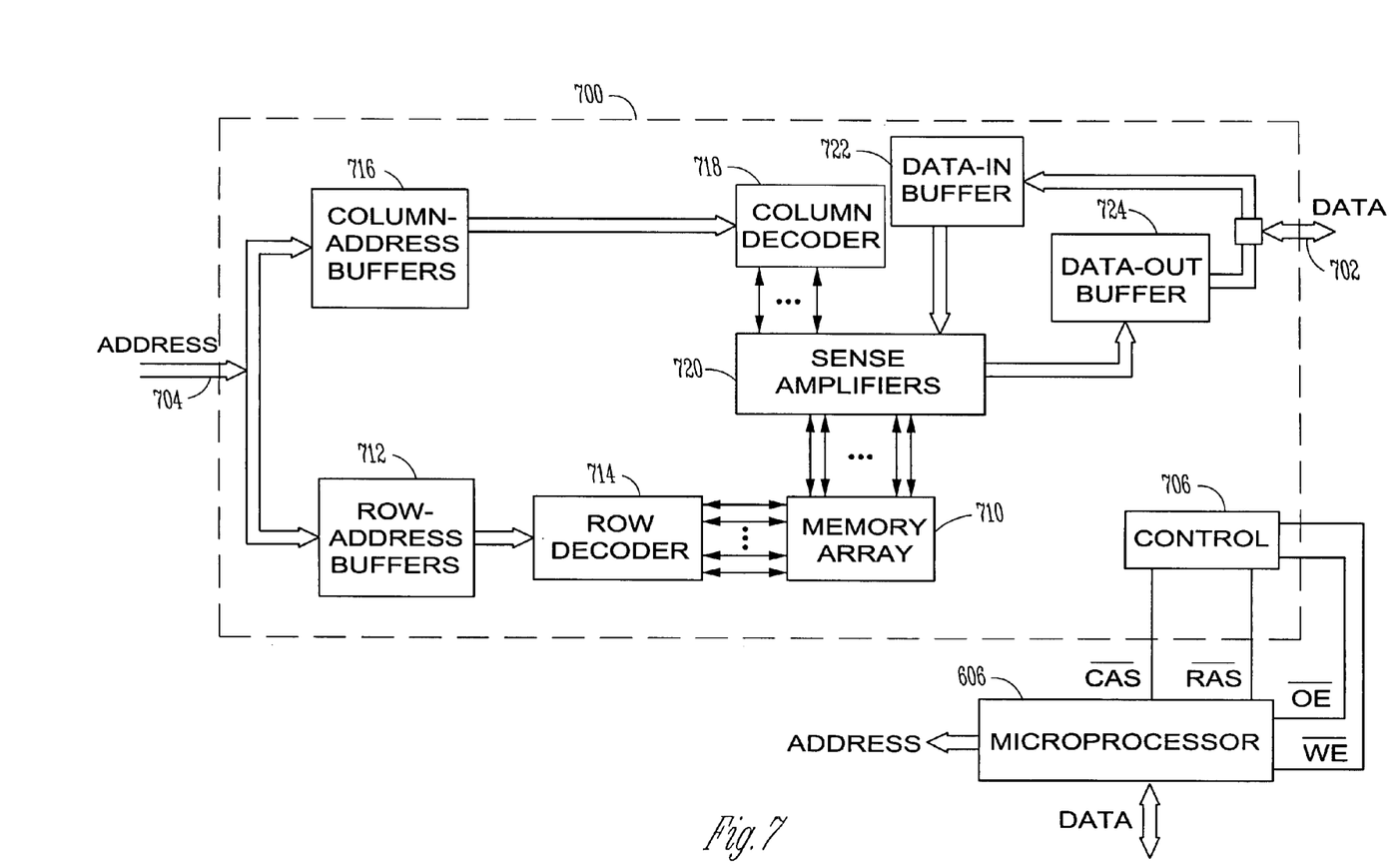
FIG. 7 shows a block diagram of a memory device according to one embodiment of the invention.

Semiconducting wafers, semiconductor devices, and IC's created by the methods described above may be implemented into memory devices and information handling devices as shown in FIG. 5, FIG. 6, and FIG. 7 and as described below. While specific types of memory devices and computing devices are shown below, it will be recognized by one skilled in the art that several types of memory devices and information handling devices could utilize the invention.

A personal computer, as shown in FIGS. 5 and 6, includes a monitor 500, keyboard input 502 and a central processing unit 504. The processor unit typically includes microprocessor 606, memory bus circuit 608 having a plurality of memory slots 612(a-n), and other peripheral circuitry 610. Peripheral circuitry 610 permits various peripheral devices 624 to interface processor-memory bus 620 over input/output (I/O) bus 622. The personal computer shown in FIGS. 5 and 6 also includes at least one transistor having a gate oxide according to the teachings of the present invention.

Microprocessor 606 produces control and address signals to control the exchange of data between memory bus circuit 608 and microprocessor 606 and between memory bus circuit 608 and peripheral circuitry 610. This exchange of data is accomplished over high speed memory bus 620 and over high speed I/O bus 622.

Coupled to memory bus 620 are a plurality of memory slots 612(a-n) which receive memory devices well known to those skilled in the art. For example, single in-line memory modules (SIMMs) and dual in-line memory modules (DIMMs) may be used in the implementation of the present invention.

These memory devices can be produced in a variety of designs which provide different methods of reading from and writing to the dynamic memory cells of memory slots 612.

One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 608. A typical communication speed for a DRAM device using page mode is approximately 33 MHZ.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 620. Other alternative types of devices include SDRAM, DDR SDRAM, SLDRAM and Direct RDRAM as well as others such as SRAM or Flash memories.

FIG. 7 is a block diagram of an illustrative DRAM device 700 compatible with memory slots 612(a-n). The description of DRAM 700 has been simplified for purposes of illustrating a DRAM memory device and is not intended to be a complete description of all the features of a DRAM. Those skilled in the art will recognize that a wide variety of memory devices may be used in the implementation of the present invention. The example of a DRAM memory device shown in FIG. 7 includes at least one transistor having a gate oxide according to the teachings of the present invention.

Control, address and data information provided over memory bus 620 is further represented by individual inputs to DRAM 700, as shown in FIG. 7. These individual representations are illustrated by data lines 702, address lines 704 and various discrete lines directed to control logic 706.

As is well known in the art, DRAM 700 includes memory array 710 which in turn comprises rows and columns of addressable memory cells. Each memory cell in a row is coupled to a common wordline. Additionally, each memory cell in a column is coupled to a common bitline. Each cell in memory array 710 includes a storage capacitor and an access transistor as is conventional in the art.

DRAM 700 interfaces with, for example, microprocessor 606 through address lines 704 and data lines 702. Alternatively, DRAM 700 may interface with a DRAM controller, a micro-controller, a chip set or other electronic system. Microprocessor 606 also provides a number of control signals to DRAM 700, including but not limited to, row and column address strobe signals RAS and CAS, write enable signal WE, an output enable signal OE and other conventional control signals.

Row address buffer 712 and row decoder 714 receive and decode row addresses from row address signals provided on address lines 704 by microprocessor 606. Each unique row address corresponds to a row of cells in memory array 710. Row decoder 714 includes a wordline driver, an address decoder tree, and circuitry which translates a given row address received from row address buffers 712 and selectively activates the appropriate wordline of memory array 710 via the wordline drivers.

Column address buffer 716 and column decoder 718 receive and decode column address signals provided on address lines 704. Column decoder 718 also determines when a column is defective and the address of a replacement column. Column decoder 718 is coupled to sense amplifiers 720. Sense amplifiers 720 are coupled to complementary pairs of bitlines of memory array 710.

Sense amplifiers 720 are coupled to data-in buffer 722 and data-out buffer 724. Data-in buffers 722 and data-out buffers 724 are coupled to data lines 702. During a write operation, data lines 702 provide data to data-in buffer 722. Sense amplifier 720 receives data from data-in buffer 722 and stores the data in memory array 710 as a charge on a capacitor of a cell at an address specified on address lines 704.

During a read operation, DRAM 700 transfers data to microprocessor 606 from memory array 710. Complementary bitlines for the accessed cell are equilibrated during a precharge operation to a reference voltage provided by an equilibration circuit and a reference voltage supply. The charge stored in the accessed cell is then shared with the associated bitlines. A sense amplifier of sense amplifiers 720 detects and amplifies a difference in voltage between the complementary bitlines. The sense amplifier passes the amplified voltage to data-out buffer 724.

Control logic 706 is used to control the many available functions of DRAM 700. In addition, various control circuits and signals not detailed herein initiate and synchronize DRAM 700 operation as known to those skilled in the art. As stated above, the description of DRAM 700 has been simplified for purposes of illustrating the present invention and is not intended to be a complete description of all the features of a DRAM.

Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

CONCLUSION

Devices and methods described above include advantages such as effective reduction in the rate of diffusion of the doping elements in very shallow junctions. The junctions can be exposed to a higher time temperature envelope without excessive degradation of the structure. Another advantage of devices and methods described above is that the methods sharpen a junction profile by reducing diffusion rates at current anneal times and temperatures. A further advantage of devices and methods described above is that solubility in doped regions will be increased. Thus allowing for a higher maximum doping level.

Diffusion of dopant atoms in a junction is further reduced when both a pocket and a region within a pocket are formed using multiple dopant atoms that are selected and proportioned as described in embodiments above. Junctions can be used to form devices that include, but are not limited to, transistors, capacitors, etc.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of forming a doped semiconductor region comprising:
   forming a first conductivity type doped semiconductor well, including introducing a first dopant element and a second dopant element, both of a first conductivity type to a selected region of a semiconductor surface;
   forming a second conductivity type doped semiconductor region substantially within the first conductivity type doped semiconductor well, including introducing a third dopant element and a fourth dopant element, both of a second conductivity type;
   annealing the selected region of the semiconductor surface;
   controlling a diffusion rate of the first and second dopant elements by selecting a combination of dopant elements that minimize lattice strain to approach an unstrained condition of an undoped semiconductor region in the selected region of the semiconductor surface; and
   controlling a diffusion rate of the third and fourth dopant elements by selecting a combination of dopant elements that minimize lattice strain to approach an unstrained condition of an undoped semiconductor region in the selected region of the semiconductor surface.

2. The method of claim 1, wherein the first conductivity type doped semiconductor well includes an N-type doped semiconductor well, and the second conductivity type doped semiconductor region includes a P-type doped semiconductor region.

3. The method of claim 2, wherein:
   the first dopant element includes phosphorous (P);
   the second dopant element includes arsenic (As);
   the third dopant element includes aluminum (Al); and
   the fourth dopant element includes boron (B).

4. The method of claim 3, wherein:
   the first dopant element includes approximately 36.37 percent phosphorous (P);
   the second dopant element includes approximately 63.63 percent arsenic (As);
   the third dopant element includes approximately 76.32 percent aluminum (Al); and
   the fourth dopant element includes approximately 23.68 percent boron (B).

5. The method of claim 1, wherein the first conductivity type doped semiconductor well includes a P-type doped semiconductor well, and the second conductivity type doped semiconductor region includes an N-type doped semiconductor region.

6. The method of claim 5, wherein:
   the first dopant element includes aluminum (Al);
   the second dopant element includes boron (B);
   the third dopant element includes phosphorous (P); and
   the fourth dopant element includes arsenic (As).

7. The method of claim 6, wherein:
   the first dopant element includes approximately 76.32 percent aluminum (Al);
   the second dopant element includes approximately 23.68 boron (B);
   the third dopant element includes approximately 36.37 percent phosphorous (P); and
   the fourth dopant element includes approximately 63.63 percent arsenic (As).

8. A method of forming a transistor comprising:
   forming a pair of source/drain regions spaced apart by a channel region, including:
       introducing a plurality of dopant elements of a first conductivity type together in selected regions of a semiconductor substrate, including a first dopant element and a second dopant element;
wherein the selected regions are within doped wells that include a plurality of dopant elements of a second conductivity type;
annealing the selected regions of the semiconductor surface; and
controlling a diffusion rate of the plurality of dopant elements by selecting a combination of dopant elements that minimize lattice strain to approach and unstrained condition of an undoped semiconductor region in the selected region of the semiconductor surface; and
forming a gate adjacent to the channel region.

9. The method of claim 8, wherein the plurality of dopant elements include a plurality of N-type dopant elements.

10. The method of claim 9, wherein the first dopant element includes arsenic (As) and the second dopant element includes phosphorous (P).

11. The method of claim 8, wherein the plurality of dopant elements include a plurality of P-type dopant elements.

12. The method of claim 11, wherein the first dopant element includes aluminum (Al) and the second dopant element includes boron (B).

13. The method of claim 8, wherein introducing a plurality of dopant elements further includes introducing a third dopant element.

14. A method of forming a memory device comprising:
forming a number of memory cells on a semiconductor substrate, wherein forming each memory cell includes:
introducing a plurality of dopant elements of a first conductivity type together in a selected region of a semiconductor substrate, including a first dopant element and a second dopant element;
wherein the selected regions are within doped wells that include a plurality of dopant elements of a second conductivity type;
annealing the selected region of the semiconductor surface;
controlling a diffusion rate of the plurality of dopant elements by selecting a combination of dopant elements that minimize lattice strain to approach and unstrained condition of an undoped semiconductor region in the selected region of the semiconductor surface;
forming a number of bitlines coupled to each memory cell;
forming a number of wordlines coupled to each memory cell; and
forming a number of sourcelines coupled to each memory cell.

15. The method of claim 14, wherein the plurality of dopant elements include a plurality of N-type dopant elements.

16. The method of claim 14, wherein introducing a plurality of dopant elements further includes introducing a third dopant element.

17. A method of forming an information handling system comprising:
forming a processor;
forming a memory device, including:
forming a number of memory cells on a semiconductor substrate, wherein forming each memory cell includes:
introducing a plurality of dopant elements of a first conductivity type together in a selected region of a semiconductor substrate, including a first dopant element and a second dopant element;
wherein the selected regions are within doped wells that include a plurality of dopant elements of a second conductivity type;
annealing the selected region of the semiconductor surface;
controlling a diffusion rate of the plurality of dopant elements by selecting a combination of dopant elements that minimize lattice strain to approach an unstrained condition of an undoped semiconductor region in the selected region of the semiconductor surface;
forming a number of bitlines, wordlines and sourcelines coupled to each memory cell; and
forming a bus coupled between the processor and the memory device.

18. The method of claim 17, wherein the plurality of dopant elements include a plurality of N-type dopant elements.

19. The method of claim 17, wherein introducing a plurality of dopant elements further includes introducing a third dopant element.

20. The method of claim 17, wherein forming a memory device includes forming a DRAM memory device.

21. A method of forming a transistor comprising:
forming a pair of source/drain regions spaced apart by a channel region, including:
forming a first conductivity type doped semiconductor well, including introducing a first dopant element and a second dopant element, both of a first conductivity type to a selected region of a semiconductor surface;
forming a second conductivity type doped semiconductor region substantially within the first conductivity type doped semiconductor well, including introducing a third dopant element and a fourth dopant element, both of a second conductivity type;
annealing the selected region of the semiconductor surface;
controlling a diffusion rate of the first and second dopant elements by selecting a combination of dopant elements that minimize lattice strain to approach an unstrained condition of an undoped semiconductor region in the selected region of the semiconductor surface;
controlling a diffusion rate of the third and fourth dopant elements by selecting a combination of dopant elements that minimize lattice strain to approach an unstrained condition of an undoped semiconductor region in the selected region of the semiconductor surface; and
forming a gate adjacent to the channel region.

22. The method of claim 21, wherein the first conductivity type doped semiconductor well includes an N-type doped semiconductor well, and the second conductivity type doped semiconductor region includes a P-type doped semiconductor region.

23. The method of claim 21, wherein the first conductivity type doped semiconductor well includes a P-type doped semiconductor well, and the second conductivity type doped semiconductor region includes an N-type doped semiconductor region.

* * * * *